(12) United States Patent
Whisnant et al.

(10) Patent No.: US 8,370,586 B2
(45) Date of Patent: Feb. 5, 2013

(54) MULTIVALUE STATISTICAL COMPRESSION OF TELEMETRIC TIME SERIES DATA IN A BOUNDED STORAGE FOOTPRINT

(75) Inventors: Keith A. Whisnant, San Diego, CA (US); Aleksey M. Urmanov, San Diego, CA (US); Kenny C. Gross, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 820 days.

(21) Appl. No.: 11/874,044

(22) Filed: Oct. 17, 2007

(65) Prior Publication Data
US 2009/0106521 A1      Apr. 23, 2009

(51) Int. Cl.
G06F 12/00      (2006.01)
(52) U.S. Cl. ......................... 711/154; 711/170
(58) Field of Classification Search .................. 711/170, 711/154; 382/239
See application file for complete search history.

(56) References Cited

U.S. PATENT DOCUMENTS

| | | | |
|---|---|---|---|
| 6,760,724 B1 * | 7/2004 | Chakrabarti et al. | 1/1 |
| 7,082,446 B1 * | 7/2006 | Bottomley | 707/610 |
| 2004/0199740 A1 * | 10/2004 | Makela et al. | 711/170 |
| 2005/0071579 A1 * | 3/2005 | Luick | 711/154 |
| 2009/0067735 A1 * | 3/2009 | Mignet et al. | 382/239 |

OTHER PUBLICATIONS

Mitte et al., "Real Time Mnitoring and Data Hiistory for Commercial Aviation", 2004, OSI Software, Inc.*

* cited by examiner

*Primary Examiner* — Matthew Bradley
(74) *Attorney, Agent, or Firm* — Park, Vaughan, Fleming & Dowler LLP

(57) ABSTRACT

Some embodiments of the present invention provide a system that stores telemetry data from a computer system. The system includes a first buffer, a second buffer, and a third buffer. During operation, the system periodically obtains the telemetry data from the computer system and stores the telemetry data in the first buffer, second buffer, and third buffer. The system also compresses the telemetry data in the first and second buffers. To compress the data, the system creates a first set of summary statistics from the telemetry data in the first buffer and the second buffer and stores the first set of summary statistics in the first buffer, which becomes a historical data buffer.

21 Claims, 9 Drawing Sheets

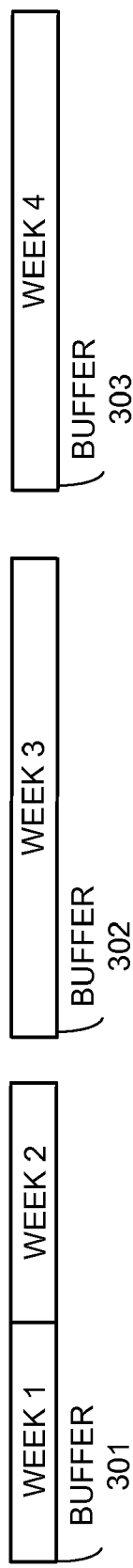
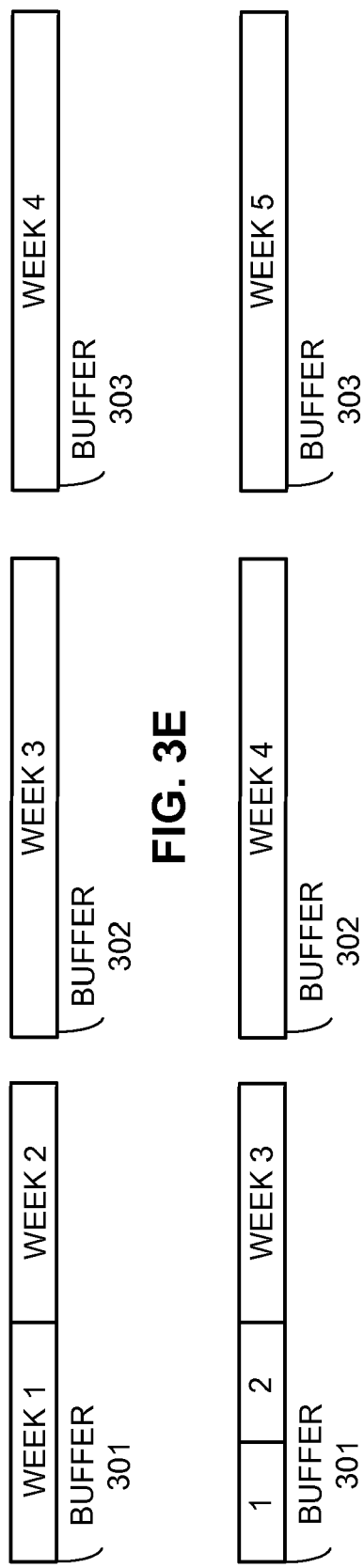
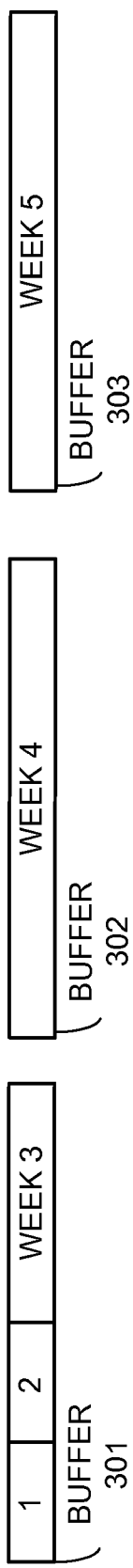
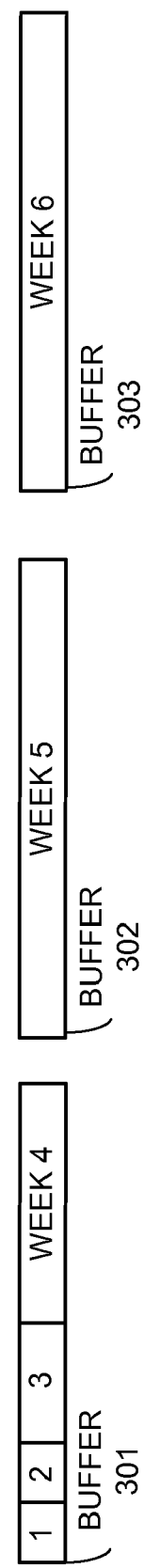
FIG. 3E
FIG. 3F
FIG. 3G
FIG. 3H

| 502 START TIMESTAMP |
| --- |
| 504 STOP TIMESTAMP |
| 506 NUMBER OF SAMPLES |
| 508 MINIMUM VALUE |
| 510 MAXIMUM VALUE |
| 512 FIRST VALUE |
| 514 LAST VALUE |
| 516 FIRST MOMENT |
| 518 SECOND MOMENT |
| 520 THIRD MOMENT |
| 522 FOURTH MOMENT |
| 524 WHITENESS METRIC |

FIG. 5

|  | Timestamp 602 | Sensor 604 | Sensor 606 |
|---|---|---|---|
| Row 610 | 15:17:06 | 1.0 | |
| Row 612 | 15:17:11 | 0.3 | |
| Row 614 | 15:17:16 | 1.8 | |
| Row 616 | 15:17:21 | 2.8 | |
| Row 618 | 15:17:26 | 1.5 | |
| Row 620 | 15:17:31 | 1.0 | |
| Row 622 | 15:17:36 | 0.5 | |
| Row 624 | 15:17:41 | 0.8 | |
| Row 626 | 15:17:46 | 2.3 | |
| Row 628 | 15:17:51 | 1.2 | |
| Row 630 | 15:17:56 | 0.3 | 133.2 |
| Row 632 | 15:18:01 | 1.0 | 129.9 |

FIG. 6A

| 640 | 642 | 644 | 646 | 648 | 650 |
|---|---|---|---|---|---|
| 15:17:06 | 15:18:01 | 12 | 0.3 | 2.8 | 1.0 |
| 1.0 | 1.21 | 0.6 | 0.84 | 0.16 | 0.27 |
| 652 | 654 | 656 | 658 | 660 | 662 |

FIG. 6B

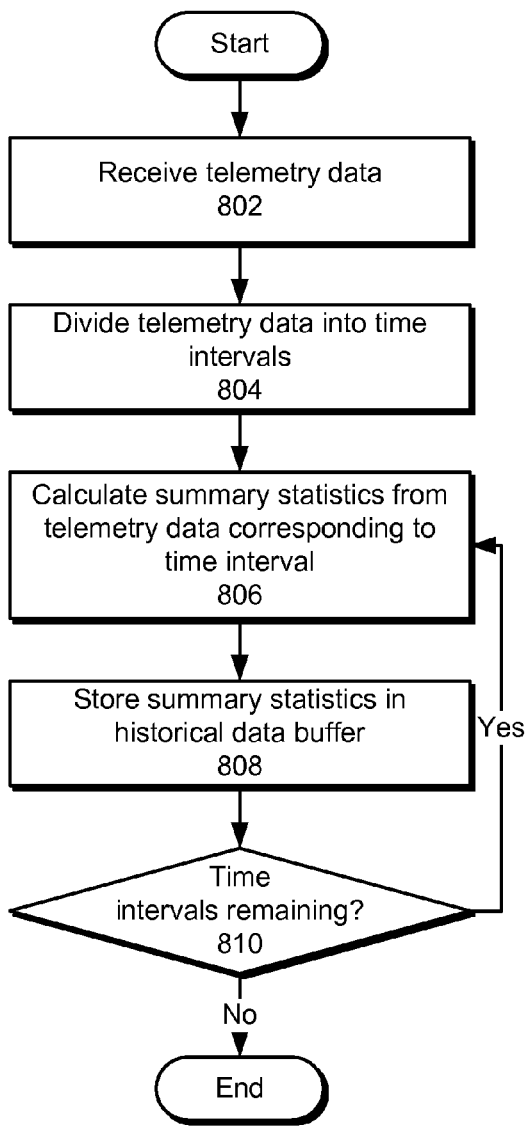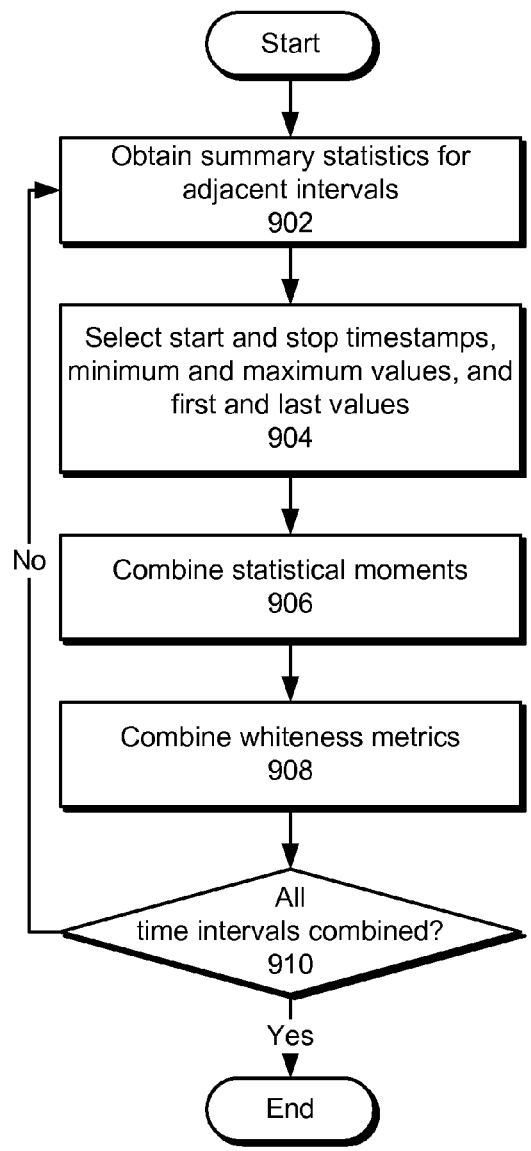
FIG. 8
FIG. 9

MULTIVALUE STATISTICAL COMPRESSION OF TELEMETRIC TIME SERIES DATA IN A BOUNDED STORAGE FOOTPRINT

RELATED APPLICATION

This application is related to a pending U.S. patent application, entitled "Method for Storing Long-Term Performance Data in a Computer System with Finite Storage Space," by inventors Kenny C. Gross, Steven K. Heller, Keith A. Whisnant, and Aleksey M. Urmanov, having Ser. No. 11/069,675, and filing date 28 Feb. 2005. The above-listed application is hereby incorporated by reference.

This application is also related to a pending U.S. patent application, entitled "Method and Apparatus for Storing Performance Parameters in a Limited Storage Space," by inventors Kenny C. Gross, Keith A. Whisnant, and Aleksey M. Urmanov, having Ser. No. 11/598,607, and filing date 13 Nov. 2006. This application is hereby incorporated by reference.

BACKGROUND

1. Field

The present invention relates to a method and apparatus for recording performance parameters from a computer system.

2. Related Art

As electronic commerce becomes more prevalent, businesses are increasingly relying on enterprise computing systems to process ever-larger volumes of electronic transactions. A failure in one of these enterprise computing systems can be disastrous, potentially resulting in millions of dollars of lost business. More importantly, a failure can seriously undermine consumer confidence in a business, making customers less likely to purchase goods and services from the business. Hence, it is important to ensure high availability in such enterprise computing systems.

To achieve high availability, it is necessary to be able to capture unambiguous diagnostic information that can quickly locate faults in hardware or software. If systems perform too little event monitoring, when a problem crops up at a customer site, service engineers may be unable to quickly identify the source of the problem. This can lead to increased down time.

Fortunately, high-end computer servers are now equipped with a large number of sensors that measure physical performance parameters such as temperature, voltage, current, vibration, and acoustics. Software-based monitoring mechanisms also monitor software-related performance parameters, such as processor load, memory and cache usage, system throughput, queue lengths, I/O traffic, and quality of service. Typically, special software analyzes the collected performance data and issues alerts when there is an anomaly. In addition, it is important to archive historical performance data to allow long-term monitoring and to facilitate detection of slow system degradation.

One challenge in archiving historical performance data is that a computer typically has limited storage space. As time progresses, cumulatively storing real-time performance data will eventually fill up the assigned storage space. One way to resolve this problem is to use a buffer, where the oldest stored performance data is discarded to make room for newly collected data. However, this approach only maintains a historical archive of the last x days. Performance data from more than x days ago is permanently lost. It is therefore difficult to know how a system performed more than x days ago. Furthermore, it is difficult to maintain a historical archive of past performance data while efficiently using the allocated storage space.

Hence, what is needed is a method and an apparatus for recording performance parameters without the problems described above.

SUMMARY

Some embodiments of the present invention provide a system that stores telemetry data from a computer system. The system includes a first buffer, a second buffer, and a third buffer. During operation, the system periodically obtains the telemetry data from the computer system and stores the telemetry data in the first buffer, second buffer, and third buffer. The system also compresses the telemetry data in the first and second buffers. To compress the data, the system creates a first set of summary statistics from the telemetry data in the first buffer and the second buffer and stores the first set of summary statistics in the first buffer, which becomes a historical data buffer.

In some embodiments, the system also obtains additional telemetry data from the computer system and stores the additional telemetry data in an emptied buffer, which can be either the second buffer or the third buffer. The system also further compresses the data by creating a second set of summary statistics from the telemetry data in the non-emptied buffer, compressing the first set of summary statistics in the historical data buffer to create space in the historical data buffer, and storing the second set of summary statistics in the created space.

In some embodiments, after multiple compressions, the historical data buffer contains sets of summary statistics with different amounts of compression.

In some embodiments, each statistic in the first set of summary statistics is calculated for a corresponding time interval associated with the telemetry data.

In some embodiments, compressing the first set of summary statistics involves merging summary statistics for adjacent time intervals.

In some embodiments, the time intervals are halved after compressing the first set of summary statistics.

In some embodiments, the telemetry data comprises at least one of: a load metric, a CPU utilization, an idle time, a memory utilization, a disk activity, a transaction latency, a temperature, a voltage, and a current.

In some embodiments, the summary statistics include at least one of: a start timestamp, a stop timestamp, a number of samples, a minimum value, a maximum value, a first value, a last value, a first moment, a second moment, a third moment, a fourth moment, and a whiteness metric.

BRIEF DESCRIPTION OF THE FIGURES

FIGS. 3A-3H show exemplary storage buffers in accordance with an embodiment of the present invention.

FIG. 5 shows a historical data buffer data structure in accordance with an embodiment of the present invention.

FIG. 6A shows an exemplary set of telemetry data samples in accordance with an embodiment of the present invention.

FIG. 6B shows an exemplary set of summary statistics in accordance with an embodiment of the present invention.

FIGS. 7-9 show flowcharts in accordance with an embodiment of the present invention.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Figure 1:
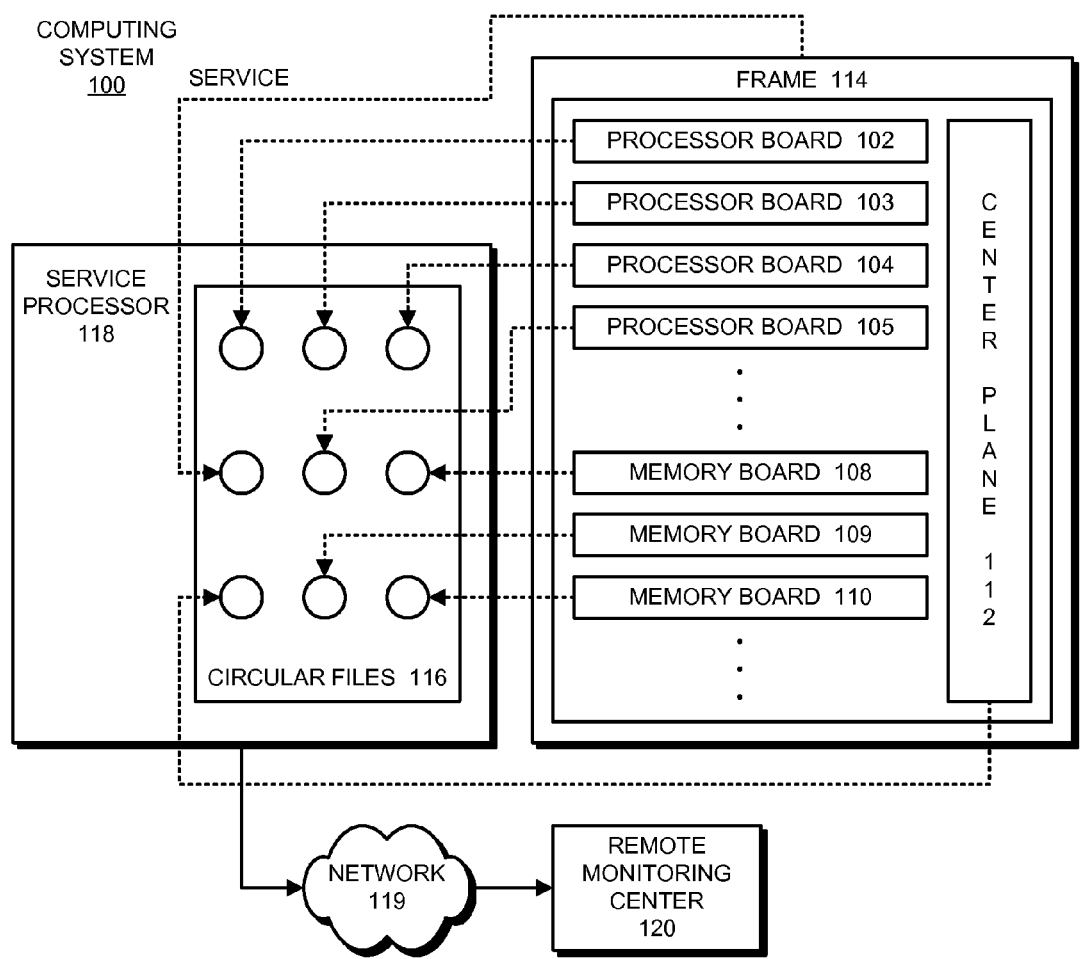
FIG. 1 shows a computer system which includes a service processor for processing telemetry signals in accordance with one embodiment of the present invention.

FIG. 1 illustrates a computer system which includes a service processor for processing telemetry signals in accordance with one embodiment of the present invention. As is illustrated in FIG. 1, computer system 100 includes a number of processor boards 102-105 and a number of memory boards 108-110, which communicate with each other through center plane 112. These system components are all housed within a frame 114.

In one embodiment of the present invention, these system components and frame 114 are all "field replaceable units" (FRUs), which are independently monitored as is described below. Note that all major system units, including both hardware and software, can be decomposed into FRUs. For example, a software FRU can include an operating system, a middleware component, a database, or an application.

Computer system 100 is associated with a service processor 118, which can be located within computer system 100, or alternatively can be located in a standalone unit separate from computer system 100. Service processor 118 performs a number of diagnostic functions for computer system 100. One of these diagnostic functions involves recording performance parameters from the various FRUs within computer system 100 into a set of circular files 116 located within service processor 118. In one embodiment of the present invention, the performance parameters are recorded from telemetry signals generated from hardware sensors and software monitors within the computer system. In one embodiment of the present invention, there exists one dedicated circular file for each FRU within computer system 100. Note that this circular file can have a three-stage structure as is described below with reference to FIG. 2.

In general, it is desirable to retain the collected performance data. For example, a system can capture the telemetry signals into a "Black Box Flight Recorder" file. This file retains digitized telemetry signals collected in the past and can be useful in diagnosing the causes of failures. One challenge, however, is to provide sufficient storage space for the "Black Box" file, because the "Black Box" file can potentially grow infinitely. One way to cope with this problem is to use a circular file, which retains only the last x days' worth of data. The drawback of using a fixed-size circular file is that one loses the long-term trend behavior of the signals. On the other hand, if one allows the "Black Box" file to grow infinitely, the file may eventually crash the storage system.

To resolve this problem, one embodiment of the present invention adopts a storage system which includes two current data buffers and a historical data buffer. All three buffers have finite sizes and may be implemented using arrays, for example. The current data buffers store uncompressed performance data for a limited amount of time (e.g., for seven days). When both current data buffers are full, data from one current data buffer is compressed and transferred to the historical data buffer. As a result, the current data buffer is freed to store additional incoming telemetry data, while the other current data buffer contains recently-collected sample-accurate data. In addition, the system recurrently compresses the data stored in the historical data buffer, thereby allowing more data to be stored in the future. In one or more embodiments of the invention, the data in the current and historical data buffers may be compressed using one or more summary statistics, as described below.

Figure 2:
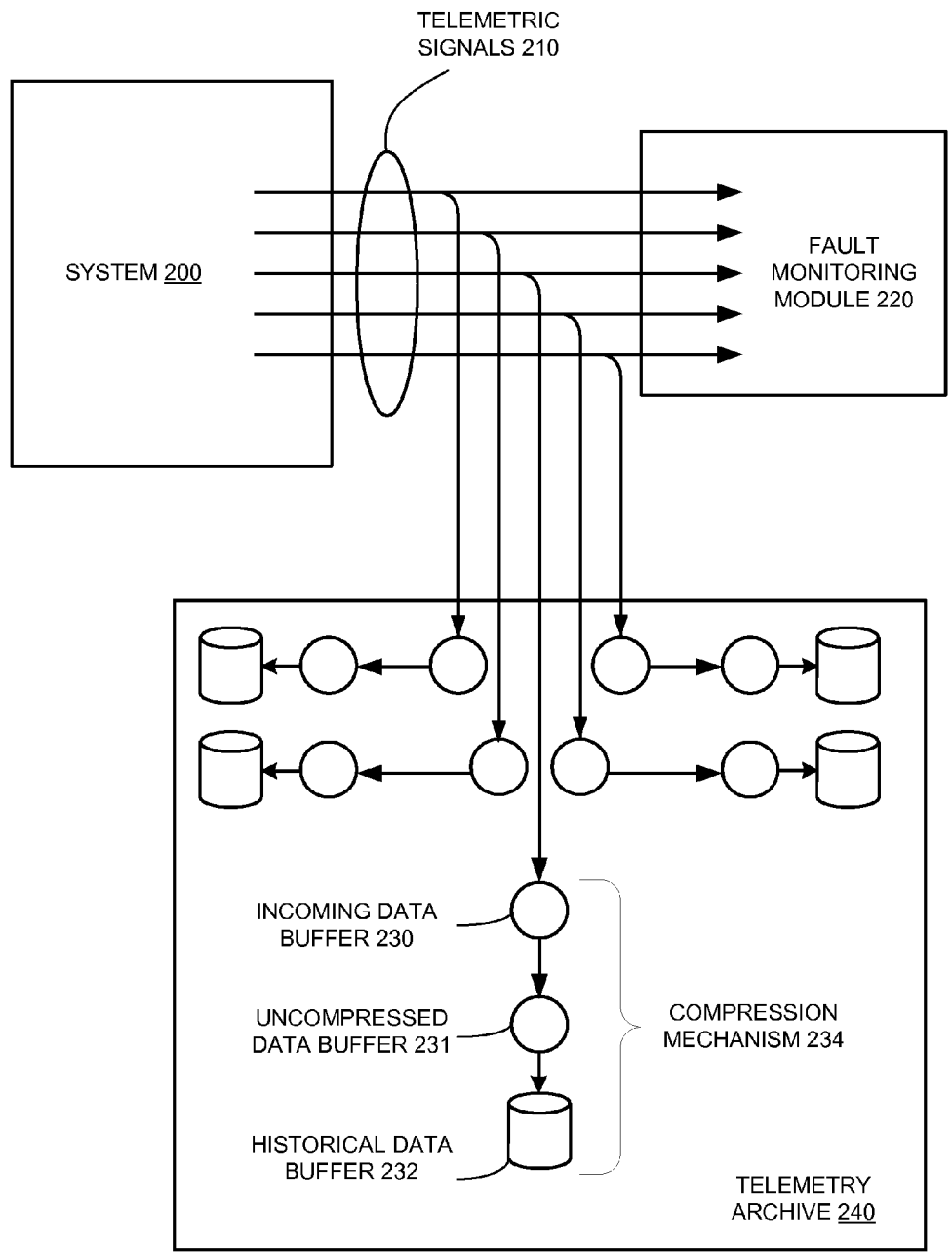
FIG. 2 shows a telemetry data archiving system which records both short-term, real-time performance data and long-term, historical performance data in accordance with an embodiment of the present invention.

FIG. 2 illustrates a telemetry data archiving system which records both short-term real-time performance data and long-term historical performance data in accordance with an embodiment of the present invention. In this example, computer system 200 is monitored with a number of telemetric signals 210, which are transmitted to a fault monitoring module 220. Fault monitoring module 220 analyses telemetric signals 210 and issues alerts when there is an anomaly.

Telemetric signals 210 are also sent to a telemetry archive 240. Within telemetry archive 240, each telemetry signal is recorded first in an incoming data buffer 230, then a uncompressed data buffer 231, and subsequently a historical data buffer 232. As shown in FIG. 2, incoming data buffer 230 saves the real-time data of one of the telemetric signals. When incoming data buffer 230 is full, its data is transferred to uncompressed data buffer 231 to allow additional incoming data to be stored in incoming data buffer 230. To make room for data from incoming data buffer 230, older data from uncompressed data buffer 231 is consolidated and transferred to historical data buffer 232. Because both incoming data buffer 230 and uncompressed data buffer 231 store raw, recently-collected telemetry data, both buffers may be referred to as "current data buffers."

In one embodiment of the present invention, incoming data buffer 230, uncompressed data buffer 231, and historical data buffer 232 are stored on a storage device (not shown). Note that the storage device can include any type of non-volatile storage device that can be coupled to a computer system. This includes, but is not limited to, magnetic, optical, and magneto-optical storage devices, as well as storage devices based on flash memory and/or battery-backed up memory.

In one embodiment of the present invention, a compression mechanism 234 compresses the data stored in uncompressed data buffer 231 before the data is transferred to historical data buffer 232. In addition, compression mechanism 234 compresses the data in historical data buffer 232 to make space for the compressed data from uncompressed data buffer 231. In one embodiment of the present invention, compression mechanism 234 divides raw telemetry data from uncompressed data buffer 231 into a series of time intervals. Compression mechanism 234 then calculates a set of summary statistics for the telemetry data samples in each time interval.

In one or more embodiments of the invention, the summary statistics calculated for each time interval include a start timestamp, a stop timestamp, a number of samples, a minimum value, a maximum value, a first value, a last value, a first moment, a second moment, a third moment, a fourth moment, and a whiteness metric. The summary statistics may then be stored in historical data buffer 232, along with further-compressed summary statistics from older time intervals. Telemetry data and summary statistics are described in further detail below with respect to FIGS. 5 and 6.

In addition, compression mechanism 234 may compress the summary statistics in historical data buffer 232 by merging the summary statistics of adjacent time intervals into a single set of summary statistics for a single, longer time interval. In one embodiment of the present invention, pairs of adjacent intervals in historical data buffer 232 are merged such that the length of the time intervals is doubled and the number of time intervals is halved after compression. Those skilled in the art will appreciate that the time intervals may also be merged in threes, fours, and/or other numbers of adjacent intervals to optimize the storage of telemetry data in accordance with one or more embodiments of the invention. Compression of telemetry data and summary statistics is described in further detail below with respect to FIGS. 3A-3H and 8-9.

FIGS. 3A-3H show exemplary storage buffers in accordance with one or more embodiments of the present invention. Specifically, FIGS. 3A-3H illustrate the storage of telemetry data over time in an incoming data buffer, current data buffer, and historical data buffer in accordance with one or more embodiments of the present invention. In the examples shown in FIGS. 3A-3H, the storage buffers contain space to store one week's worth of raw, uncompressed telemetry data.

Figure 3A:
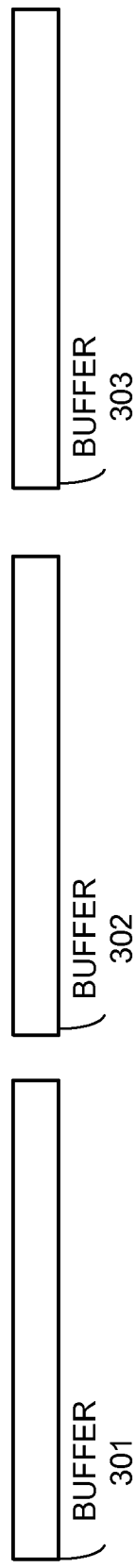

FIG. 3A shows three empty storage buffers (e.g., buffer 301, buffer 302, buffer 303). As mentioned above, the storage buffers are of finite size and may be implemented as arrays. In addition, the storage buffers may be instantiated before telemetry data is collected by the computer system, such as the computer system of FIG. 1. Moreover, while the exemplary buffers in FIGS. 3A-3H are of equal size, those skilled in the art will appreciate that the buffers may be sized arbitrarily and the compression mechanism adjusted to handle varying buffer sizes.

Initially, all three buffers are configured to store sample-accurate telemetry data from the computer system. In other words, buffer 301, buffer 302, and buffer 303 are initially filled with raw, uncompressed telemetry data from the computer system. In one or more embodiments of the invention, the telemetry data may include a timestamp and one or more values from one or more sensors. The sensors may monitor the performance of both hardware and software in the computer system. For example, the telemetry data may include software parameters such as load metrics, CPU utilization, idle time, memory utilization, disk activity, transaction latencies, and other performance metrics reported by the operating system. The telemetry data may also include hardware parameters such as temperature, voltage, and current.

Figure 3B:
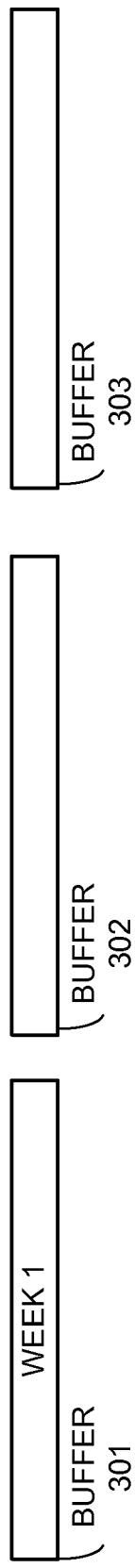

As shown in FIG. 3B, buffer 301 is filled with data from week 1. In one or more embodiments of the invention, when buffer 301 is filled to a threshold, buffer 302 is used to store real-time telemetry data. Similarly, when buffer 302 is filled to a threshold, buffer 303 is used to store real-time telemetry data. Specifically, in the example illustrated in FIGS. 3A-3H, buffers 301-303 each have capacity to store telemetry data recorded over the span of a week. As a result, buffer 301 is full when telemetry data from week 1 is stored in buffer 301.

Figure 3C:

Further, buffer 302 begins storing telemetry data when buffer 301 is full. In other words, buffer 301 has reached a threshold when buffer 301 is full. In one or more embodiments of the invention, an exception is issued when a buffer's threshold is reached, causing data to be stored in the next open buffer. As shown in FIG. 3C, buffer 302 stores telemetry data from week 2, which corresponds to telemetry data received after buffer 301 is filled to capacity with telemetry data from week 1. Because buffer 302 also has capacity for a week of telemetry data, buffer 302 is full in FIG. 3C and the same threshold is reached for buffer 302 as for buffer 301.

Figure 3D:

Consequently, buffer 303 begins storing telemetry data received after week 2, and as with buffers 301-302, buffer 303 is full once all of week 3's telemetry data is stored in buffer 303. FIG. 3D shows three full buffers; buffer 301 contains telemetry data from week 1, buffer 302 contains telemetry data from week 2, and buffer 303 stores telemetry data from week 3. Because the storage capacities for the buffers have been reached, the telemetry data must be compressed to make room for additional telemetry data from the computer system.

In one or more embodiments of the invention, raw telemetry data is compressed by dividing the telemetry data into a series of time intervals and calculating a set of summary statistics describing the telemetry data associated with each time interval. As mentioned above, the summary statistics may include a start timestamp, a stop timestamp, a number of samples, a minimum value, a maximum value, a first value, a last value, a first moment, a second moment, a third moment, a fourth moment, and a whiteness metric. The summary statistics may then be stored in a historical data buffer, which is selected from one of the three buffers. In one or more embodiments of the invention, the number and size of time intervals in the historical data buffer are based on the storage capacity of the historical data buffer, as well as the sampling rate of the telemetry data. In other words, the number and size of time intervals may be initially set such that the summary statistics occupy a similar amount of storage space as the uncompressed telemetry data and the telemetry data samples are evenly divided by the time intervals. Alternatively, if the historical data buffer is of a different size from the current data buffers, the time intervals may be set to suitably fit the storage capacity of the historical data buffer.

FIG. 3E shows the buffers after telemetry data from week 1 and week 2 is compressed and stored in buffer 301. Buffer 301 is converted into a historical data buffer and stores summary statistics for a number of time intervals spanning week 1 and week 2. For example, buffer 301 may include capacity for 16 time intervals of summary statistics. Consequently, each time interval spans 21 hours when telemetry data from week 1 and week 2 is compressed into buffer 301. Raw telemetry data from week 3 is stored in buffer 302, and buffer 303 is freed to store telemetry data from week 4. In one or more embodiments of the invention, buffer 302 corresponds to uncompressed data buffer 231 of FIG. 2, and buffer 303 corresponds to incoming data buffer 230 of FIG. 2. As a result, buffer 301 stores compressed summary statistics, buffer 302 stores uncompressed telemetry data from the most recently filled buffer, and buffer 303 stores incoming telemetry data from the computer system.

Those skilled in the art will appreciate that multiple methods exist for transferring telemetry data and summary statistics between the historical data buffer, incoming data buffer, and uncompressed data buffer. For example, raw telemetry data in buffers 301-302 may be copied to a temporary location for calculation of summary statistics. The data in buffer 301 may then be overwritten with the summary statistics. In addition, telemetry data from the most recently filled buffer (e.g., buffer 303) may be transferred to the uncompressed data buffer (e.g., buffer 302) by swapping pointers to the memory locations of each buffer or manually copying the data between the buffers. Alternatively, buffers 302-303 may take turns receiving incoming telemetry data. As one buffer is filled to capacity with incoming telemetry data, older telemetry data stored in the other buffer is compressed and stored in the historical data buffer, allowing the older telemetry data in the other buffer to be overwritten with incoming telemetry data.

FIG. 3F shows the storage buffers after five weeks of telemetry data have been collected. Buffer 301 includes summary statistics from week 1, week 2, and week 3, buffer 302 stores uncompressed telemetry data from week 4, and buffer 303 stores the newest telemetry data from week 5. As shown in FIG. 3F, the summary statistics from weeks 1 and 2 have been further compressed to make room for summary statistics from week 3. Further, the summary statistics from week 3 occupy the same amount of space in buffer 301 as the summary statistics from weeks 1 and 2 combined. As a result, the time intervals for weeks 1 and 2 are twice as long as the time intervals for week 3. Using the example of 16 time intervals in buffer 301 (i.e., historical data buffer), weeks 1 and 2 occupy eight time intervals together, each with a length of 42 hours, and week 3 occupies eight time intervals, each of which is 21 hours long.

FIG. 3G shows the storage buffers after six weeks of telemetry data have been collected. Weeks 1, 2, and 3 have been compressed into the first half of buffer 301 to make room for summary statistics from week 4, which are stored in the second half of buffer 301. Uncompressed telemetry data from week 5 is stored in buffer 302, and the most recent telemetry data received during week 6 is stored in buffer 303. Continuing with the example of 16 time intervals in buffer 301, weeks 1 and 2 now occupy four time intervals, each spanning 84 hours, week 3 occupies four time intervals, each spanning 42 hours, and week 4 occupies eight time intervals, each spanning 21 hours. As a result, buffer 301 contains 16 sets of summary statistics with different amounts of compression and/or granularity. More recent data is stored at a higher granularity and/or with less compression, and older data is stored at a lower granularity and/or with more compression. In addition, the most recent telemetry data to fill a buffer to capacity is stored uncompressed until all buffers are full or nearly full, allowing the raw telemetry data to be examined and/or analyzed for a period of time after the buffer is filled.

FIG. 3H shows the storage buffers after seven weeks of telemetry data have been collected. Buffer 301 contains summary statistics for the first five weeks, while buffer 302 contains uncompressed telemetry data from week 6 and buffer 303 contains the most recently-received telemetry data from week 7. Buffer 301 now includes summary statistics at four different levels of compression; weeks 1 and 2 each take up $\frac{1}{16}$ of buffer 301, week 3 takes up $\frac{1}{8}$ of buffer 301, week 4 occupies $\frac{1}{4}$, and week 5 occupies $\frac{1}{2}$. With 16 time intervals of summary statistics in buffer 301, weeks 1 and 2 each occupy a single time interval of 168 hours in length, week 3 is split among two time intervals of 84 hours each, week 4 is stored in four time intervals of 42 hours each, and week is stored in eight intervals of 21 hours each.

Figure 4:
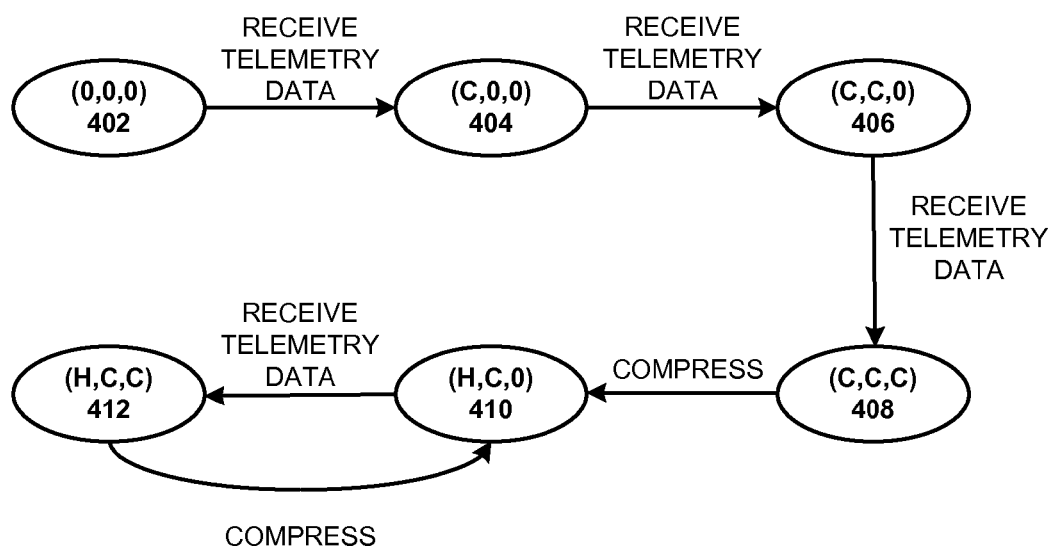
FIG. 4 shows a state diagram of the storage buffers in accordance with an embodiment of the present invention.

FIG. 4 shows a state diagram of telemetry data storage buffers in accordance with an embodiment of the present invention. State 402 represents an initial state in which all three buffers are empty. As telemetry data is received and stored in the first buffer, a threshold is reached in the first buffer and the buffers transition to state 404. As described above, the threshold may be reached when the buffer is full, and an exception may be raised to initiate the state transition. In state 404, the first buffer contains current telemetry data and the other two buffers remain empty.

As telemetry data continues to be received, the second buffer is filled with the telemetry data until the same threshold of fullness is reached in the second buffer. Once the second buffer has reached the threshold, the buffers transition to state 406. State 406 illustrates the three buffers with the first and second buffers filled with current telemetry data and the third buffer empty. Telemetry data from the computer system is subsequently stored in the third buffer until the third buffer is full or nearly full. Once the third buffer is full or nearly full, the buffers transition to state 408, which shows all three buffers with uncompressed telemetry data.

When the third buffer is full or nearly full, the buffers cannot accommodate more telemetry data unless some of the telemetry data stored in the buffers is compressed. To make room for additional telemetry data, the data in the first two buffers is compressed and stored in the first buffer as historical data, and the data in the third buffer is transferred to the second buffer. The third buffer is then freed to store additional incoming telemetry data from the computer system, as shown in state 410.

As incoming telemetry data fills the third buffer, state 412 is eventually reached, in which the first buffer contains historical data and the second and third buffers are filled with current, uncompressed data. Once again, the data is compressed to allow additional data to be stored in the buffers. Compression of data in state 412 may involve further compressing the historical data in the first buffer to make space for data from the second buffer. In addition, data from the second buffer is also compressed to fit in the space in the first buffer. Data from the third buffer is transferred to the second buffer, the third buffer is freed to store additional incoming data, and the buffers revert to state 410. The buffers may continue to alternate between states 410-412 as more incoming telemetry data is provided.

FIG. 5 shows a historical data buffer data structure in accordance with an embodiment of the present invention. As mentioned previously, data in the current data buffers and data in the historical data buffer may be represented in different ways. In one or more embodiments of the invention, the data structure for storing one unit of telemetry data may include a timestamp and one or more sensor values from the computer system. On the other hand, the data structure for storing one unit of historical data may include a number of summary statistics and a time interval, as explained below. A certain number of telemetry data samples may be stored in the same amount of space as a different number of historical data samples. Consequently, the number of intervals in the historical data buffer is based on the storage capacity of the historical data buffer and the size of the summary statistic data structure. Further, the length of each interval is calculated such that the number of telemetry data samples is evenly divided by the intervals.

In one or more embodiments of the invention, the data structure of FIG. 5 stores a set of summary statistics that represent telemetry data collected within a specific time interval. The summary statistics include a start timestamp 502, a stop timestamp 504, a number of samples 506, a minimum value 508, a maximum value 510, a first value 512, a last value 514, a first moment 516, a second moment 518, a third moment 520, a fourth moment 522, and a whiteness metric 524. Each of the values in the data structure may be determined from one or more telemetry data samples in the time interval, which is denoted by start timestamp 502 and stop timestamp 504.

Number of samples 506 corresponds to the number of samples in the time interval bounded by start timestamp 502 and stop timestamp 504. For example, if telemetry data is collected once every second and the time interval spans a minute, number of samples 506 may contain a value of either 59 or 60. In addition, minimum value 508 contains the minimum value found in the telemetry data samples, and maximum value 510 contains the maximum value found in the telemetry data samples. First value 512 and last value 514 store the first and last values of the telemetry data samples within the time interval.

First moment 516, second moment 518, third moment 520, and fourth moment 522 correspond to moments of the statistical distribution represented by the telemetry data. In one or more embodiments of the invention, first moment 516 corresponds to the mean, second moment 518 corresponds to the variance, third moment 520 corresponds to the skew, and fourth moment 522 corresponds to the kurtosis. Those skilled in the art will appreciate that the moments are descriptors of the statistical distribution represented by the telemetry data. As a result, the moments provide a richer statistical characterization of the telemetry data than other compression techniques, such as averaging two samples or discarding every other sample. In addition, artificial, statistically-accurate telemetry data may be reconstructed from the moments for analysis purposes, while lossier compression methods may not provide enough information to generate statistically-accurate data from.

Whiteness metric 524 represents a goodness-of-fit test between the telemetry data and the underlying distribution. In one or more embodiments of the invention, whiteness metric 524 is calculated using a Kolmogorov-Smirnov statistic. Those skilled in the art will appreciate that other goodness-of-fit tests may be used instead, such as the Jarque-Bera test, Kuiper's test, the Shapiro-Wilk test, and/or the Anderson-Darling test. Those skilled in the art will also appreciate that whiteness metric 524 may test the goodness-of-fit between the telemetry data and a variety of distributions, such as uniform distributions, normal distributions, cumulative distribution functions, and/or other statistical distributions.

FIG. 6A shows an exemplary set of telemetry data samples in accordance with an embodiment of the present invention. Specifically, FIG. 6A shows 12 rows of telemetry data samples. Each row includes a timestamp 602 and a value from a sensor 604. In addition, rows 630-632 include values from a second sensor 606. In one or more embodiments of the invention, a column is created for a sensor (e.g., sensor 604, sensor 606) when data is first received from the sensor. As a result, the appearance of a value from sensor 606 in row 630 indicates that data was first provided by sensor 606 at 15:17:56. The timestamps also indicate that a sampling rate of every five seconds over the course of slightly less than a minute.

As mentioned above, the telemetry data samples from rows 610-632 may be stored in a buffer. Further, additional telemetry data samples may continue to be stored in the buffer until the buffer is full and an exception is raised. To make room for additional data, the samples may be compressed into one or more sets of summary statistics. In one or more embodiments of the invention, each set of summary statistics is calculated from the telemetry data samples with timestamps that fall within a certain time interval.

FIG. 6B shows an exemplary set of summary statistics in accordance with an embodiment of the present invention. In one or more embodiments of the invention, the summary statistics of FIG. 6B are calculated from 12 rows of sensor values associated with sensor 604 in FIG. 6A. The summary statistics include a start timestamp 640, a stop timestamp 642, a number of samples 644, a minimum value 646, a maximum value 648, a first value 650, a last value 652, a first moment 654, a second moment 656, a third moment 658, a fourth moment 660, and a whiteness metric 662.

Start timestamp 640 contains a value of 15:17:06, which corresponds to timestamp 602 of row 610 in FIG. 6A. Stop timestamp 642 contains a value of 15:18:01, which corresponds to timestamp 602 of row 632 in FIG. 6A. Start timestamp 640 and stop timestamp 642 define the time interval of telemetry data represented by the remaining summary statistics. Number of samples 644 contains a value of 12, which represents the 12 telemetry data samples shown in rows 610-632 of FIG. 6A. In addition, the summary statistics have a minimum value 646 of 0.3, a maximum value 648 of 2.8, a first value 650 of 1.0, and a last value 652 of 1.0, which are also selected from values of sensor 604 in rows 610-632.

First moment 654, second moment 656, third moment 658, and fourth moment 660 correspond to statistical moments of the telemetry data. First moment 654 has a value of 1.21 and represents the mean of the data. Second moment 656 has a value of 0.6 and represents the variance of the data. Third moment 658 has a value of 0.84 that corresponds to the skew of the data, and fourth moment 660 has a value of 0.16 and corresponds to the kurtosis of the data. Finally, the whiteness metric 662 of 0.27 is based on the Kolmogorov-Smirnov statistic obtained from comparing the sample data from sensor 604 with a uniform distribution with minimum value 0 and maximum value 3. As mentioned above, whiteness metric 662 may be calculated using different goodness-of-fit tests and/or distributions based on the nature of the data and/or the underlying hypothesized distributions.

Figure 7:
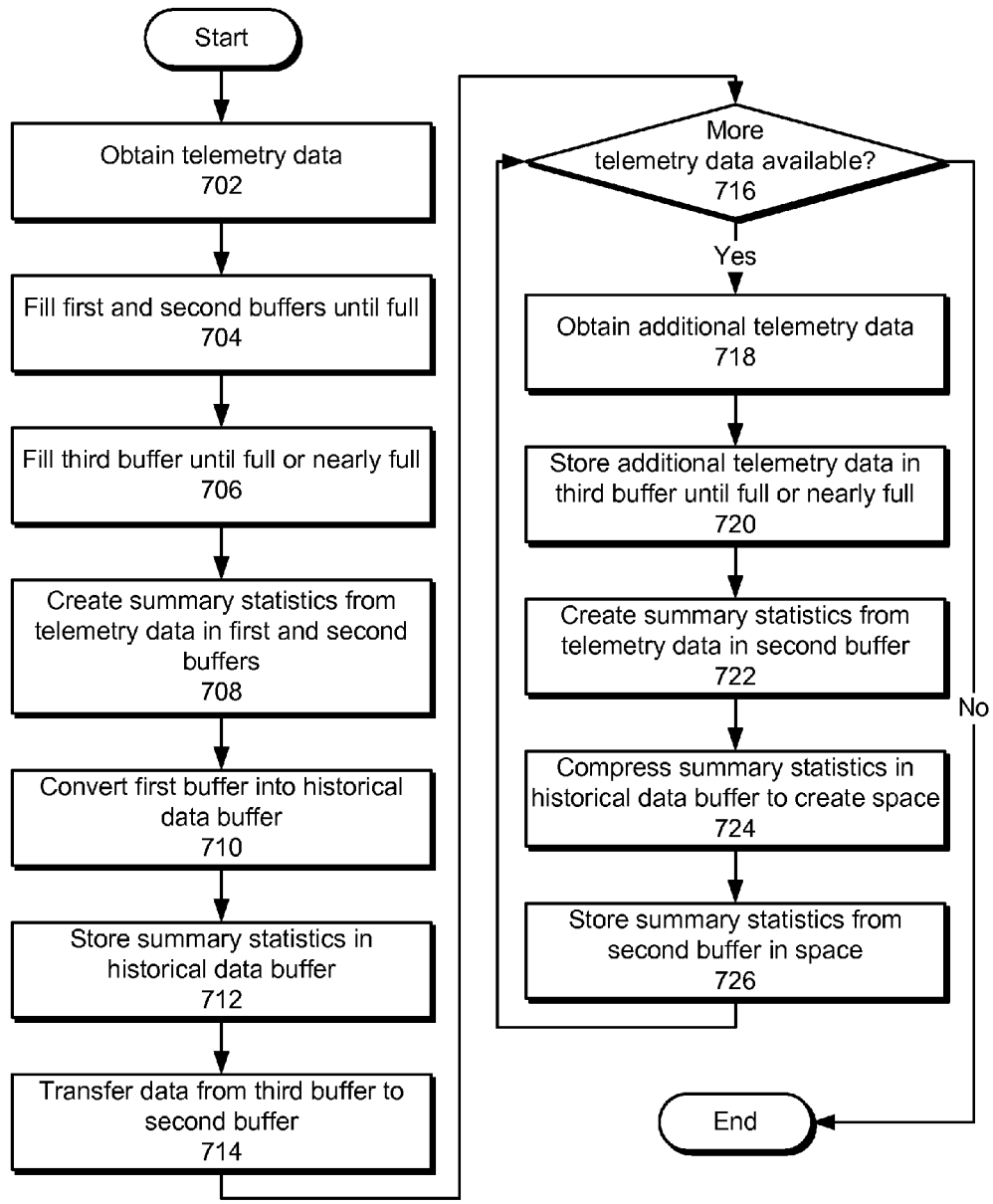

FIG. 7 shows a flowchart of processing and storing telemetry data from a computer system in accordance with an embodiment of the present invention. In one or more embodiments of the invention, one or more of the steps may be omitted, repeated, and/or performed in a different order. Accordingly, the specific arrangement of steps shown in FIG. 7 should not be construed as limiting the scope of the invention.

Initially, telemetry data is obtained from the computer system (operation 702). The telemetry data may include a timestamp as well as values from one or more sensors. In addition, the telemetry data may include sensor values for parameters such as load metrics, CPU utilization, idle time, memory utilization, disk activity, transaction latencies, temperature, voltage, and current. The incoming telemetry data is stored in a first and second buffer until both buffers are full (operation 704). The telemetry data is then stored in a third buffer until the third buffer is full or nearly full (operation 706). In one or more embodiments of the invention, an exception is raised when each of the buffers is full or nearly full, causing the telemetry data to be stored in the next buffer until all buffers are full or nearly full.

To create room for additional telemetry data from the computer system, summary statistics are created from the telemetry data in the first and second buffers (operation 708). As described above, the summary statistics are generated for telemetry data in each interval of a series of time intervals. To store the telemetry data, the first buffer is converted into a historical data buffer (operation 710). As a result, the first buffer is configured to store historical data instead of raw, uncompressed telemetry data. The summary statistics are then stored in one or more summary statistic data structures in the historical data buffer (operation 712).

Telemetry data from the third buffer is transferred to the second buffer (operation 714). As a result, the second buffer stores the most recent buffer-full of raw telemetry data, while the third buffer is freed to store more incoming telemetry data. As mentioned above, the telemetry data may be transferred between the second and third buffers by manually copying the data or exchanging pointers to the buffers. Alternatively, the buffers may take turns storing older telemetry data and receiving incoming telemetry data.

The computer system may continue to provide telemetry data (operation 716). If more telemetry data is available, the additional telemetry data is obtained (operation 718) and stored in the third or freed buffer until the buffer is full or nearly full (operation 720). Once the buffer is full or nearly full, an exception is raised, and summary statistics are created from the telemetry data in the second and/or older buffer (operation 722). The summary statistics in the historical data buffer are further compressed to create space for the summary statistics from the second and/or older buffer (operation 724), and the summary statistics from the second and/or older buffer are stored in the space (operation 726). The process of obtaining and storing additional telemetry data, compressing older telemetry data into summary statistics, and compressing summary statistics in the historical data buffer to make room for the summary statistics from the older telemetry data repeats (operation 718-726) until no more telemetry data is provided by the computer system.

FIG. 8 shows a flowchart of telemetry data compression in accordance with an embodiment of the present invention. In one or more embodiments of the invention, one or more of the steps may be omitted, repeated, and/or performed in a different order. Accordingly, the specific arrangement of steps shown in FIG. 8 should not be construed as limiting the scope of the invention.

First, the telemetry data to be compressed is received (operation 802). The telemetry data is divided into time intervals (operation 804). In one or more embodiments of the invention, the time intervals are set such that the telemetry data samples are evenly divided among the intervals and the intervals fit into a historical data buffer. For example, 40 samples of telemetry data spanning two hours may be divided into eight intervals of 15 minutes each, with five samples per interval.

Summary statistics are calculated from the telemetry data samples corresponding to each time interval (operation 806). As described above, the summary statistics may include a start timestamp, a stop timestamp, a number of samples, a minimum value, a maximum value, a first value, a last value, a first moment, a second moment, a third moment, a fourth moment, and a whiteness metric. The summary statistics for the interval are then stored in the historical data buffer (operation 808). If remaining time intervals need to be processed (operation 810), the process of generating summary statistics and storing the summary statistics in the historical data buffer (operations 806-808) is repeated for telemetry data in each time interval.

FIG. 9 shows a flowchart of summary statistic compression in accordance with an embodiment of the present invention. In one or more embodiments of the invention, one or more of the steps may be omitted, repeated, and/or performed in a different order. Accordingly, the specific arrangement of steps shown in FIG. 9 should not be construed as limiting the scope of the invention.

Initially, summary statistics for adjacent intervals are obtained (operation 902) so that the adjacent intervals may be merged into a single, longer interval. As a result, summary statistics are obtained for each adjacent interval to be merged into the single, longer interval.

The start and stop timestamps, minimum and maximum values, and first and last values for the merged interval are selected from the sets of summary statistics (operation 904). Specifically, the earliest and latest timestamps are used as the start and stop timestamps, and the minimum and maximum values are selected from the minimum and maximum values in the summary statistics for the adjacent intervals. The first value in the first interval is used as the first value for the combined interval, and the last value in the last interval is used as the last value for the combined interval.

The statistical moments are also combined (operation 906). In one or more embodiments of the invention, the statistical moments are combined by storing the sum of the individual moments. Those skilled in the art will appreciate that two or more normal distributions may be combined to form another normal distribution with moments that are sums of the individual moments of the individual distributions. As a result, the mean of the combined interval is stored as the sum of the means of the adjacent intervals, the variance as the sum of the variances, the skew as the sum of the skews, and the kurtosis as the sum of the fourth moments. Those skilled in the art will also appreciate that other methods of combining statistical moments for telemetry data from adjacent intervals are well-known and may be used.

In addition, whiteness metrics from the adjacent intervals are combined (operation 908). As with the other summary statistics, multiple well-known methods may be used to combine the whiteness metrics from the adjacent intervals.

If all time intervals in the buffer have not been combined with at least one other time interval (operation 910), the process of obtaining summary statistics for adjacent intervals and combining the summary statistics (operations 902-908) is repeated. The compression process has completed when all time intervals in the buffer have been combined and the size of the buffer has been reduced by a factor equal to the number of adjacent intervals combined into each new interval.

The foregoing descriptions of embodiments have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for storing telemetry data from a computer system, comprising:
   periodically obtaining the telemetry data from the computer system;
   storing the telemetry data in a first buffer, a second buffer, and a third buffer in a non-volatile computer-readable storage medium, wherein each buffer is stored in a separate location in the non-volatile computer-readable storage medium;
   when the first buffer and second buffer are full, and when the third buffer is full or nearly full, compressing the telemetry data in the first and second buffers by:
   creating a first set of summary statistics from the telemetry data in the first buffer and the second buffer, wherein the summary statistics include one or more moments for a statistical distribution for the telemetry data; and
   storing the first set of summary statistics in the first buffer which becomes a historical data buffer.

2. The method of claim 1, further comprising:
   obtaining additional telemetry data from the computer system;
   storing the additional telemetry data in an emptied buffer, wherein the emptied buffer can be either the second buffer or the third buffer;

creating a second set of summary statistics from the telemetry data in the non-emptied buffer;
compressing the first set of summary statistics in the historical data buffer to create space in the historical data buffer; and
storing the second set of summary statistics in the created space.

3. The method of claim 2, wherein after multiple compressions, the historical data buffer contains sets of summary statistics with different amounts of compression.

4. The method of claim 2, wherein each statistic in the first set of summary statistics is calculated for a corresponding time interval associated with the telemetry data.

5. The method of claim 4, wherein compressing the first set of summary statistics involves merging summary statistics for adjacent time intervals.

6. The method of claim 5, wherein the time intervals are halved after compressing the first set of summary statistics.

7. The method of claim 1, wherein the telemetry data comprises at least one of:
a load metric;
a CPU utilization;
an idle time;
a memory utilization;
a disk activity;
a transaction latency;
a temperature;
a voltage; and
a current.

8. The method of claim 1, wherein the summary statistics include at least one of:
a start timestamp;
a stop timestamp;
a number of samples;
a minimum value;
a maximum value;
a first value;
a last value;
a first moment;
a second moment;
a third moment;
a fourth moment; and
a whiteness metric.

9. The method of claim 1, wherein the one or more moments for the statistical distribution include at least one of a skew and a kurtosis.

10. A system for storing telemetry data from a computer system, comprising:
a non-volatile computer-readable storage medium;
a first buffer, a second buffer, and a third buffer, wherein each buffer is stored in a separate location in the non-volatile computer-readable storage medium;
a monitoring mechanism configured to:
periodically obtain the telemetry data from the computer system; and
store the telemetry data in the first buffer, second buffer, and third buffer, and
a compression mechanism configured to, when the first buffer and second buffer are full, and when the third buffer is full or nearly full, compress the telemetry data in the first and second buffers by:
creating a first set of summary statistics from the telemetry data in the first buffer and the second buffer, wherein the summary statistics include one or more moments for a statistical distribution for the telemetry data; and
storing the first set of summary statistics in the first buffer which becomes a historical data buffer.

11. The system of claim 10,
wherein the monitoring mechanism is further configured to:
obtain additional telemetry data from the computer system; and
store the additional telemetry data in an emptied buffer, wherein the emptied buffer can be either the second buffer or the third buffer, and
wherein the compression mechanism is further configured to:
create a second set of summary statistics from the telemetry data in the non-emptied buffer;
compress the first set of summary statistics in the historical data buffer to create space in the historical data buffer; and
store the second set of summary statistics in the created space.

12. The system of claim 11, wherein after multiple compressions, the historical data buffer contains sets of summary statistics with different amounts of compression.

13. The system of claim 11, wherein each statistic in the first set of summary statistics is calculated for a corresponding time interval associated with the telemetry data.

14. The system of claim 13, wherein compressing the first set of summary statistics involves merging summary statistics for adjacent time intervals.

15. The system of claim 14, wherein the time intervals are halved after compressing the first set of summary statistics.

16. The system of claim 11, wherein the summary statistics include at least one of:
a start timestamp;
a stop timestamp;
a number of samples;
a minimum value;
a maximum value;
a first value;
a last value;
a first moment;
a second moment;
a third moment;
a fourth moment; and
a whiteness metric.

17. The system of claim 10, wherein the telemetry data comprises at least one of:
a load metric;
a CPU utilization;
an idle time;
a memory utilization;
a disk activity;
a transaction latency;
a temperature;
a voltage; and
a current.

18. A non-transitory computer-readable storage medium storing instructions that when executed by a computer cause the computer to perform a method for processing telemetry data, the method comprising:
periodically obtaining the telemetry data from the computer system;
storing the telemetry data in a first buffer, a second buffer, and a third buffer in a non-volatile computer-readable storage medium, wherein each buffer is stored in a separate location in the non-volatile computer-readable storage medium;
when the first buffer and second buffer are full, and when the third buffer is full or nearly full, compressing the telemetry data in the first and second buffers by:

creating a first set of summary statistics from the telemetry data in the first buffer and the second buffer, wherein the summary statistics include one or more moments for a statistical distribution for the telemetry data; and storing the first set of summary statistics in the first buffer which becomes a historical data buffer.

19. The computer-readable storage medium of claim 18, the method further comprising:

obtaining additional telemetry data from the computer system;

storing the additional telemetry data in an emptied buffer, wherein the emptied buffer can be either the second buffer or the third buffer;

creating a second set of summary statistics from the telemetry data in the non-emptied buffer;

compressing the first set of summary statistics in the historical data buffer to create space in the historical data buffer; and storing the second set of summary statistics in the created space.

20. The computer-readable storage medium of claim 19, wherein each statistic in the first set of summary statistics is calculated for a corresponding time interval associated with the telemetry data.

21. The computer-readable storage medium of claim 20, wherein compressing the first set of summary statistics involves merging summary statistics for adjacent time intervals.

* * * * *